(12) United States Patent
Nishimura et al.

(10) Patent No.: US 6,323,642 B1
(45) Date of Patent: Nov. 27, 2001

(54) DETECTOR FOR DETERMINING ROTATIONAL SPEED AND POSITION FOR AN INTERNAL COMBUSTION ENGINE

(75) Inventors: Masayuki Nishimura; Tsuyoshi Yamaguchi; Koji Hiragi; Shinichi Maruo; Mitsuhiro Izumi, all of Osaka (JP)

(73) Assignee: Diamond Electric Mfg. Co., Ltd., Osaka (JP)

( * ) Notice: Subject to any disclaimer, the term of this patent is extended or adjusted under 35 U.S.C. 154(b) by 0 days.

(21) Appl. No.: 09/433,295

(22) Filed: Nov. 3, 1999

(51) Int. Cl.[7] .............................. G01B 7/30; G01R 33/07; G01P 3/488; F02D 35/00
(52) U.S. Cl. .................. 324/207.2; 324/174; 324/207.25
(58) Field of Search ............................ 324/207.2, 207.21, 324/207.23, 207.24, 207.25, 207.26, 251, 252, 174; 338/32 H, 32 R; 123/617, 406.58

(56) References Cited

U.S. PATENT DOCUMENTS 5,341,097 * 8/1994 Wu ...................................... 324/207.2
5,796,247 * 8/1998 Pape ................................... 324/207.2

FOREIGN PATENT DOCUMENTS 10-293041 * 11/1998 (JP) .

* cited by examiner

Primary Examiner—Safet Metjahic
Assistant Examiner—Reena Aurora
(74) Attorney, Agent, or Firm—Liniak, Berenato, Longacre & White

(57) ABSTRACT

A rotational position detecting apparatus for an internal-combustion engine for use with a Hall IC comprising at least two Hall elements for detecting the protrusion of a rotator. One of the two Hall elements is arranged with a magnet for forming a magnetic field, and the magnet is disposed on one side of the Hall IC to form a magnetic circuit for converging the magnetic flux on only one element within the Hall IC.

3 Claims, 1 Drawing Sheet

DETECTOR FOR DETERMINING ROTATIONAL SPEED AND POSITION FOR AN INTERNAL COMBUSTION ENGINE

BACKGROUND OF THE INVENTION

This invention relates to an apparatus for detecting a crank angle and a cam angle in the control unit of an internal-combustion engine and also detecting the rotational speed of a driving system portion.

It has been well known to use a sensor having Hall elements in the form of an integrated circuit for detecting positions of a crank angle and a cam angle of an internal-combustion engine and also detecting a rotational speed in a driving system. The magnetic circuit of one known sensor includes an IC, and a magnet and a yoke core which are disposed on the back of the IC. Another known sensor includes a Hall IC and a magnet facing the Hall IC, so that the position of an object and the like are detected when the object passes therebetween.

Among those conventional sensors, a type called a differential type for detecting a magnetic material from a difference in output between two Hall elements within an IC has a magnetic circuit preformed for causing the magnetic flux to be substantially uniformly converged on the two elements. Then a comparator therein has been used to convert into pulses the differential value between both the elements and a differential value resulting from causing one of the elements to undergo response delay by means of a capacitor. Moreover, a magnet having a greater magnetic flux quantity has been employed for supplying a stable output.

As set forth above, an arrangement of two Hall elements in a differential Hall IC permits the magnetic flux to be substantially uniformly converged, so that an element-to-element output difference (hereinafter called the 'magnetic flux change') in the absence of a protrusion becomes equal to zero. Consequently, when the width of the protrusion is greater with respect to the direction of rotation, the magnetic flux change during the passage of the protrusion also becomes equal to zero as in the case where no protrusion exists. Therefore, the amount of delay in response because of the capacitor is minimized when the protrusion passing speed is low at the time of low-speed rotation, which results in greatly varying a position to be converted into a pulse. The basic magnetic flux change is extremely redundant and this has made the conversion to pulse difficult at a stable position.

SUMMARY OF THE INVENTION

An object of the present invention in view of the foregoing problems is to provide a rotational position detecting apparatus capable of detecting an accurate rotational position, irrespective of the number of rotations.

In order to solve the aforementioned problems, a rotational position detecting apparatus for an internal-combustion engine for use with a Hall IC comprising at least two Hall elements for detecting the protrusion of a rotator is characterized in that one of the two Hall elements is arranged with a magnet for forming a magnetic field and that the magnet is disposed on one side of the Hall IC to form a magnetic circuit for converging the magnetic flux on only one element within the Hall IC.

DETAILED DESCRIPTION OF THE PREFERRED EMBODIMENTS

Figure 1:
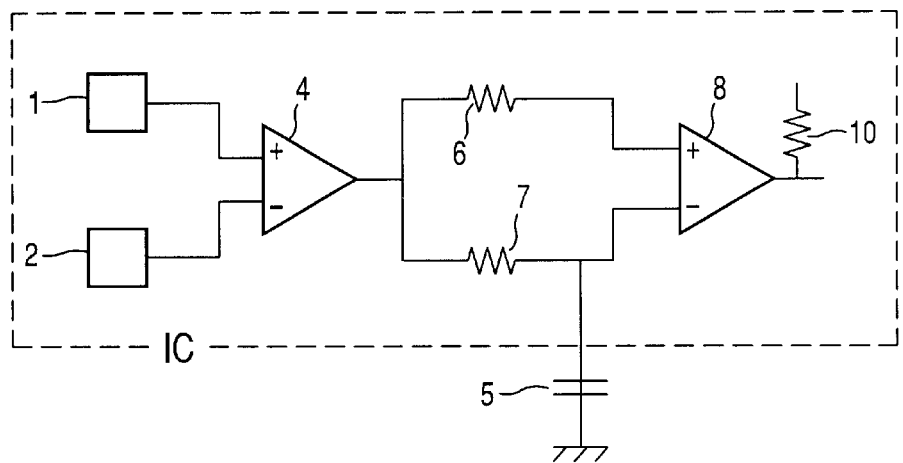
FIG. 1 is a schematic internal connection diagram of a Hall IC.
Figure 2:
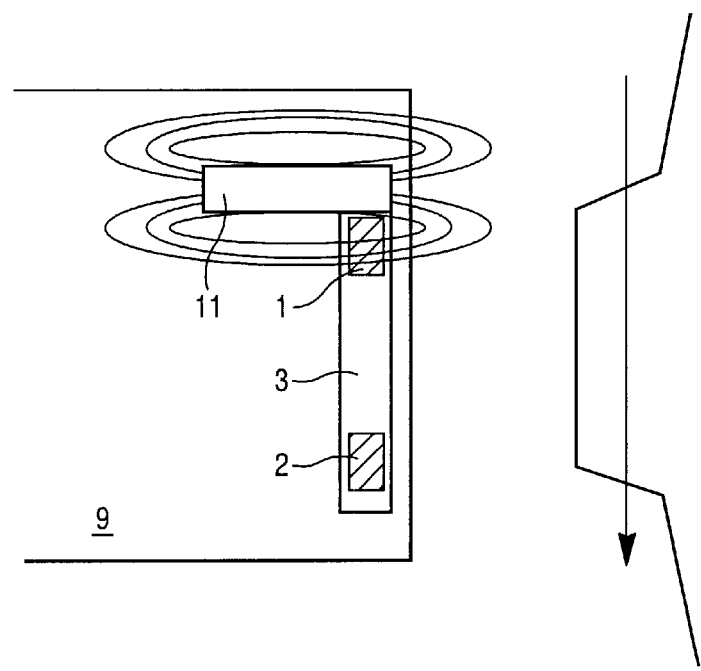
FIG. 2 is a schematic diagram of a rotor of an internal-combustion engine and a sensor installed in the vicinity thereof.

FIGS. 1 and 2 show the constitution of the present invention. FIG. 1 is a schematic internal connection diagram of a Hall IC; and FIG. 2 shows the relation between a rotator of an internal-combustion engine and a sensor installed in the vicinity thereof.

As shown in FIG. 1 first, a Hall IC 3 comprises a differential amplifier 4 connected to a Hall element 1 and a Hall element 2 and used for taking in the outputs of both Hall elements, a resistor 6 and a resistor 7 which are connected in parallel to the output of the differential amplifier 4, a capacitor 8 to which the outputs of the resistors 6 and 7 are connected, and a resistor 10 connected to the output of the comparator 8, a capacitor 5 being connected to the resistor 7. A magnet 11 is magnetized in the direction of a protrusion, and its polarity on the protrusion side is N.

Referring to FIG. 2 next, the protrusion is equivalent to a 'mark' put on the rotator rotating in direction of arrow indicative of the 'direction in which the protrusion is moved.' Further, a sensor 9 having the aforementioned Hall IC 3 is disposed to the left of the rotator, and the magnet 11 is installed on the side of the Hall element 1 of the Hall IC 3. The sensor 9 is thus configured.

With the arrangement above, the Hall element 1 is provided on the entrance side of the protrusion, whereas the Hall element 2 is provided on the exit side thereof. The magnet 11 may be provided to the Hall element 1 on the entrance side of the protrusion or otherwise it may be arranged for the Hall element 2 on the exit side thereof. The differential amplifier 4 functions as what processes a difference in output between two Hall elements 1 and 2 within the Hall IC 3, that is, 'the output of the Hall element 1—the output of the Hall element 2.' The capacitor 5 is used for determining the detected frequency. The comparator 8 is used for converting into pulses the magnetic flux changes detected by the resistors 6 and 7.

According to this embodiment with reference to FIG. 2, the magnet 11 is disposed on the entrance side of the protrusion in the Hall IC, and the value resulting from subtracting the output of the Hall element 2 from the output of the Hall element 1 is outputted from the differential amplifier 4. As the Hall IC 3 is not positioned on an extension in the magnetizing direction of the magnet 11 then, the magnetizing direction of the magnet 11 and the detecting surface of the Hall IC 3 are lined up in parallel, whereby the magnetic flux connecting both poles of the magnet 11 is detected.

The operation and function of the above arrangement will subsequently be described. First, the magnetic field is strongly distributed on the side of the Hall element 1 by the magnet 11 provided on the side of the Hall element 1 while the sensor 9 and the protrusion are not facing each other. Thus, the magnetic flux quantity biased toward the Hall element 1 becomes greater than the quantity biased toward the Hall element 2. Consequently, the output of the differential amplifier 4 has a positive value.

When the protrusion approaches the sensor 9, the magnetic field starts being distributed over the protrusion since the magnet 11 is disposed on the entrance side of the protrusion in the Hall IC 3, and the magnetic flux is led to the protrusion. Therefore, the magnetic flux quantity biased toward the Hall element 1 is decreased, so that the output of the differential amplifier 4 is directed to the negative side.

While the sensor 9 and the protrusion are facing each other, the magnetic field is formed toward the protrusion in accordance with the permeance of the magnet 11, and the magnetic field distribution of the Hall element 1 becomes weaker than the magnetic field distribution before the moving of the protrusion inside. In other words, the magnetic flux quantity biased toward the Hall element 1 is also decreased, so that the output of the differential amplifier 4 is further directed to the negative side.

When the protrusion is set apart from the sensor 9, the formation of the magnetic field distributed over the protrusion from the magnet 11 gradually becomes weaker. The magnetic flux quantity biased toward the Hall element 1 is increased because the magnetic field distribution toward the Hall element 1 ultimately becomes stronger and the output of the differential amplifier 4 is directed to the positive side.

With the arrangement above, the output of the differential amplifier 4 at the inputted from only one-side element when a sensor 9 does not confront the protrusion, whereby pulses are stably outputted from the comparator 8 even at the time of low-speed rotation. Further, the pulse output is produced from the comparator 8 immediately before the moving of the protrusion inside and outside, and simultaneously the pulse output immediately before the moving of the protrusion outside is produced at a position stabler that that immediately before the moving of the protrusion inside.

It is preferably to obtain an effect by the rotational position detecting apparatus for an internal-combustion engine, when the protrusion rotates in a range of 0 to 10,000 rpm.

Further, it is preferably to obtain an effect by the rotational position detecting apparatus for an internal-combustion engine, when a distance between the two Hall elements has a length of 0 to 2.5 mm.

What is claimed is:

1. A rotational position detecting apparatus for an internal-combustion engine comprising:

a Hall IC including two Hall elements for detecting a protrusion of a rotator, wherein one of said two Hall elements has a magnet for forming a magnetic field, said magnet being disposed on one side of said Hall IC to form a magnetic circuit for converging the magnetic flux on only one element within said Hall IC.

2. The rotational position detecting apparatus for an internal-combustion engine as claimed in claim 1, wherein said protrusion rotates in a range of 0 to 10,000 rpm.

3. The rotational position detecting apparatus for an internal-combustion engine as claimed in claim 1, wherein a distance between the two Hall elements is between 0 to 2.5 mm.

* * * * *